United States Patent [19]

Aspnes et al.

[11] 4,380,490

[45] Apr. 19, 1983

[54] METHOD OF PREPARING SEMICONDUCTOR SURFACES

[75] Inventors: David E. Aspnes, Watchung; Ambrose A. Studna, Raritan, both of N.J.

[73] Assignee: Bell Telephone Laboratories, Incorporated, Murray Hill, N.J.

[21] Appl. No.: 248,549

[22] Filed: Mar. 27, 1981

[51] Int. Cl.$^3$ .................. C03C 15/00; H01L 21/306; C03C 25/06

[52] U.S. Cl. ........................................ 156/662; 134/3; 134/28; 134/29; 156/636; 156/638; 156/903; 252/79.1; 252/79.3; 252/79.4; 252/79.5

[58] Field of Search .............. 156/636, 638, 645, 662, 156/903; 148/175; 252/79.1, 79.4, 79.3, 79.5; 134/3, 41, 42, 28, 29

[56] References Cited

U.S. PATENT DOCUMENTS

| | | | |
|---|---|---|---|
| 2,619,414 | 11/1952 | Heidenreich | 252/79.4 X |
| 3,156,596 | 11/1964 | Sullivan | 156/903 X |
| 3,262,825 | 7/1966 | Fuller | 156/903 X |
| 3,577,286 | 5/1971 | Berkenblit et al. | 156/662 X |
| 3,629,023 | 12/1971 | Strehlow | 156/636 |
| 3,869,324 | 3/1975 | Basi et al. | 156/638 X |
| 3,969,164 | 7/1976 | Cho | 156/662 X |
| 4,184,908 | 1/1980 | Lackner et al. | 156/903 X |

OTHER PUBLICATIONS

RCA Review, vol. 39, Jun. 1978, Chemical Etching of Silicon, Germanium, Gallium Arsenide, and Gallium Phosphide by W. Kern, pp. 278–308.

Journal of the Electrochemical Society, vol. 123, No. 12, Dec. 1976, Chemical Etching of Silicon by B. Schwartz et al., pp. 1903–1909.

*Primary Examiner*—William A. Powell
*Attorney, Agent, or Firm*—Richard D. Laumann

[57] ABSTRACT

A method of treating semiconductor surfaces to produce an abrupt dielectric discontinuity between the semiconductor bulk and the ambient is described.

9 Claims, No Drawings

METHOD OF PREPARING SEMICONDUCTOR SURFACES

TECHNICAL FIELD

This invention relates to a method of preparing semiconductor surfaces having an abrupt dielectric discontinuity between the semiconductor bulk and the ambient.

BACKGROUND OF THE INVENTION

Semiconductors, both crystalline and amorphous, are extremely important in modern day electronics and are used in the fabrication of many types of devices, e.g., photodetectors, lasers and memory circuits. Although many processing sequences are used in fabricating these and other devices, an essential step in fabricating all devices, particularly when the fabrication technique is molecular beam epitaxy (MBE) or chemical vapor deposition (CVD), is the preparation of semiconductor surfaces that are smooth, clean and undamaged.

In many processing sequences, such surfaces are prepared by chemical etchants. The etchant typically has two or more components. A first component oxidizes and/or reduces the semiconductor constituents to form reaction products and a second component acts as the solvent for the reaction products produced by the first component. For example, silicon may be etched by a mixture consisting of $HNO_3$ (nitric acid) and HF (hydrofluoric acid). For this combination, the oxidizing agent is $HNO_3$ and the solvent is HF. Another etchant which was developed for germanium, but was also used with silicon, consisted of HF, $HNO_3$, $CH_3COOH$ and a small amount of bromine. This etchant was widely used and is referred to as CP-4. Chemical etching of silicon is surveyed in detail in *Journal of the Electrochemical Society*, 123, pp. 1903–1909, Dec. 19, 1976. Another commonly used semiconductor compound, GaAs, is commonly etched by a mixture of $Br_2$—$CH_3OH$ (methanol) which is commonly referred to as bromine-methanol. This etchant is described in U.S. Pat. No. 3,262,825 issued on July 26, 1966. Other etchants such as NaOH—$H_2O_2$ (sodium hydroxide-hydrogen peroxide), $H_2SO_4$—$H_2O_2$—$H_2O$ (sulfuric acid-hydrogen peroxide-water), and $NH_4OH$—$H_2O_2$—$H_2O$ (ammonium hydroxide-hydrogen peroxide-water) have also been used with GaAs. Chemical etching of these and other semiconductor materials is reviewed at length in *RCA Review*, 39, pp. 278–308, June, 1978.

The quality of semiconductor surfaces prepared by etchants is not as easily assessed as might be thought and a variety of methods has been developed to assess the effectiveness of the different chemical etchants as well as other preparatory techniques. For example, the semiconductor surface may be examined with an optical microscope, a secondary ion mass spectrometer or a scanning electron microscope. Other methods, such as Auger electron spectroscopy or LEED (low energy electron diffraction) are also used but require ultra high vacuum. Moreover, the results are often ambiguous because of oxidation and contamination resulting from exposure to the ambient atmosphere while the sample is transported to the vacuum chamber.

Another method, spectroscopic ellipsometry, has recently been brought to a high state of perfection. This technique, which may be used in the ambient atmosphere, measures the apparent dielectric function $<\epsilon> = <\epsilon_1> + i<\epsilon_2>$ of the material directly after treatment. At the wavelength of the $E_2$ peak of the $<\epsilon_2>$ spectrum it permits a very sensitive and unambiguous indication of the dielectric discontinuity between the substrate and ambient. $E_2$ is the maximum value of $<\epsilon_2>$. The measurements yield information about the presence of residual oxides and other overlayers as well as the selvedge region and surface microstructure and bulk degradation effects. This method is described in *Journal of Vacuum Science and Technology*, 17, pp. 1057–1060 (1980), and relies on the fact that an overlayer with a dielectric response having a magnitude between the dielectric responses of the substrate and the ambient will impedance match the ambient to the substrate. This match reduces the amount of light reflected from the substrate. If the ellipsometric data are evaluated in a two phase model which assumes a mathematically sharp boundary between the substrate and ambient and ignores the possible presence of boundary layers, the impedance matching can be simulated only by reducing the apparent or pseudo dielectric function $<\epsilon>$ of the substrate. The quantitative relation between $<\epsilon>$ and the true substrate dielectric function $\epsilon_s = \epsilon_{s1} + i\epsilon_{s2}$ is approximately $$<\epsilon> = \epsilon_s + \frac{4\pi i d}{\lambda} \epsilon_s \left(1 - \frac{\epsilon_o}{\epsilon_s}\right) \left(1 - \frac{\epsilon_a}{\epsilon_o}\right)$$

where $\epsilon_a$ and $\epsilon_o$ are the dielectric functions of the ambient and a uniform overlayer of thickness, d, respectively and $\lambda$ is the wavelength of light. It is further assumed that $d << \lambda$. Also, $\epsilon_o$ and d may refer to effective averages for graded regions. Degradation of the bulk leads to a similar expression.

The wavelength corresponding to the energy of the $E_2$ peak of the dielectric function spectrum $<\epsilon_2> \simeq \epsilon_{s2}$ is a logical measurement choice for assessing semiconductor surfaces for at least two reasons. First, the absorption coefficient is near maximum and as a result, there is minimum light penetration into the semiconductor and maximum surface sensitivity. Second, the $E_2$ peak itself tends to have a relatively high value due to the unique combination of chemistry and crystal structure of the substrate and if either is modified, $<\epsilon_2>$ is reduced and usually substantially. As a result, all overlayers tend to look alike from the perspective of the substrate and the impedance matching argument at this wavelength is essentially universal.

While the known etching methods are perfectly adequate for many purposes, methods for producing still more abrupt discontinuities in the dielectric function, and thus cleaner and smoother surfaces, are desirable.

SUMMARY OF THE INVENTION

It has been found that semiconductor surfaces having an abrupt dielectric discontinuity between the bulk and the ambient may be obtained by (1) pretreating, (2) chemomechanically polishing the semiconductor surface with a bromine-methanol mixture, and (3) stripping residual layers. If the surface is exposed to the ambient atmosphere after the chemomechanical polish, rinsing with a bromine-methanol solution reestablishes the passivating layer. In a preferred embodiment, the initial bromine content of the solution used for chemomechanical polishing is less than approximately 1.0 percent, by volume, and the semiconductor is silicon or germanium. The method appears especially well suited for use with the <111> surface of silicon. For this surface, the ellipsometrically determined $<\epsilon_2>$ value is approximately 48.05. With the $<100>$ and $<110>$ surfaces of silicon, $<\epsilon_2>$ values of approximately 44.75 and 44.62, respectively, were obtained. Values this high have never been obtained before.

DETAILED DESCRIPTION

The semiconductor surfaces were analyzed during surface preparation by spectroscopic ellipsometry. This technique, as discussed previously, relies on the fact that measurements of the dielectric function at the wavelength corresponding to the energy of the $E_2$ peak of the $<\epsilon_2>$ spectrum provides a sensitive and unambiguous indication of the sharpness of the dielectric discontinuity between the substrate and ambient. Intermediate films, e.g., an oxide layer or a contaminant, as well as microscopic roughness lower the apparent value of $<\epsilon_2>$. These measurements therefore yield direct information about the relative surface quality with the highest value of $<\epsilon_2>$ indicating the highest quality surface. Surfaces prepared by different techniques may be compared by these measurements although initially they answer only the question of how much interface material is present and not the question of what this material is. Information with respect to the nature of the interface material may be obtained by analysis of the full $<\epsilon>$ spectrum after the approximate substrate dielectric function $\epsilon_s$ has been obtained. A detailed description of the spectroscopic ellipsometer and the technique used to analyze the data, and thus to characterize the surface quality, is described in *Applied Optics*, 14, pp. 220-228, January, 1975 and *Reviews of Scientific Instruments*, 49, pp. 291-297, March, 1978.

Ellipsometric data were taken continuously at 4 second intervals. Reagent or semiconductor grade chemicals were used.

The semiconductor surfaces were first given a standard pretreatment, such as Syton polishing for Si and Ge, $Br_2$-methanol followed by either HCl or $NH_4OH$ based solutions for Ga-V compounds, and Tizox polishing for InAs. The purpose of the pretreatment is to remove saw damage and native oxides. The semiconductor surfaces were next given a chemomechanical polish of bromine-methanol on a polishing pad. Other halogens and organic solvents could also be used. The chemomechanical polish is nonpreferential and leaves no etch pits but does remove hydrocarbons and reduces microscopic and macroscopic roughness. In one embodiment, the chemomechanical polishing began with an approximately 0.05 volume percent Br solution which was diluted to all methanol within a time of 20 to 30 seconds. The slow dilution quenches the etching. Higher initial bromine concentrations may be used. The upper limit is the concentration at which microscopic roughness begins to appear. Lower concentrations may be used but longer treatments will generally be required.

The semiconductor was then placed in a cell where the surface preparation could be completed while the surface quality was evaluated. If the semiconductor surface is exposed to the ambient atmosphere during transfer to the cell, it may be rinsed in a $Br_2$-methanol polishing solution to reestablish the passivating layer. For example, 0.05 volume percent bromine in methanol was used with Si and Ge.

The next step in surface preparation comprises stripping residual layers by flowing solutions over the surface of the sample to remove residual layers left by the polishing treatment. Finally, the surface is dried with filtered $N_2$.

The bromine content of the rinse for GaAs is important in obtaining the best surfaces. As the bromine content decreases, surface quality generally increases. For Si, the procedure for obtaining the best results depends upon the surface being prepared. The procedure for obtaining results are summarized in the Table.

| Material | Doping (cm$^{-3}$) | Procedure | $\epsilon_2$ peak |
|---|---|---|---|
| Si $<111>$ | n 2.3 × 10$^{14}$ | BRM, HF5, AMH, HF5/MeOH | 48.05 |
| $<110>$ | n 2.0 × 10$^{14}$ | BRM, BHF/MeOH | 44.75 |
| $<100>$ | n 1.6 × 10$^{14}$ | BRM, HF5/MeOH | 44.62 |
| Ge $<111>$ | n 2.5 × 10$^{14}$ | BRM, BHF/H$_2$O | 30.74 |
| $<110>$ | n 2.0 × 10$^{14}$ | BRM, BHF/H$_2$O | 29.93 |
| $<100>$ | n 3.0 × 10$^{14}$ | BRM, BHF/H$_2$O | 30.53 |
| GaP $<110>$ | undoped | BRM, H$_2$O, NH$_4$OH/H$_2$O | 27.09 |
| GaAs $<100>$ | n 1.7 × 10$^{17}$ | AMH, BRM, H$_2$O | 25.74 |
| GaSb $<111>$ | p 1.5 × 10$^{17}$ | BRM, H$_2$O | 25.28 |
| InP $<100>$ | undoped | BRM, H$_2$O, NH$_4$OH | 23.00 |
| InAs $<110>$ | n 2.7 × 10$^{16}$ | AMH, BRM, H$_2$O, AMH | 22.81 |
| InSb $<110>$ | n 8 × 10$^{15}$ | BRM/MeOH | 20.89 |
| InSb $<100>$ | p 2 × 10$^{17}$ | BRM/MeOH | 20.12 |

All of the materials were given a pretreatment and a chemomechanical polish as described. Measurements were made at 4.25 eV for Si and Ge and 5.05, 4.78, 4.03, 4.71, 4.44 and 3.85 for GaP, GaAs, GaSb, InP, InAs and InSb, respectively. BRM is 0.05 volume percent Br in methanol, AMH is 1:1, by volume, $NH_4OH:H_2O$; BHF is buffered HF; HF5 is 5 volume percent HF in methanol and MeOH is methanol. Concentrations of $NH_4OH$ and HF are exemplary and other concentrations may be used.

Although Br-methanol is a standard polishing agent for Ga-Group V compounds, higher values for $<\epsilon_2>$ were obtained with the method of this invention. After pretreating by rough polishing with 0.5 volume percent Br-methanol and removing the natural oxides, best results were obtained with the chemomechanical polish using 0.05 volume percent bromine in methanol, diluted to methanol as described above, and rinsing, if exposed to the ambient atmosphere, with Br-methanol and then, after drying, stripping the residual layers. It is believed that better surfaces are obtained because the stripping after the bromine-methanol chemomechanical polish reduces the amount of surface roughness and removes passivating bromide layers.

The results indicate that Br-methanol chemomechanical polishing may be used to prepare smooth semiconductor surfaces and, when followed by a stripping step, to minimize the amount of interface material remaining on the surface after preparation. These two features are probably related. After the surface of a given substrate has been prepared according to the method outlined, certain sequences of chemical treatments induce characteristic sequential changes in $<\epsilon>$ even if the limiting values of $<\epsilon_2>$ are not as high as the best values obtained. These characteristic changes indicate a common outer layer chemistry and, consequently, lower values of $<\epsilon_2>$ must be due to microscopic roughness or to bulk material damaged in the polishing. While damaged bulk material can be removed by chemical etching, the elimination of microscopic roughness is more delicate. It is known that roughness is reduced if one constituent of an etch-polish rapidly forms a passive layer that dissolves slowly in another constituent. It is also clear that mechanical motion could aid the latter process of the substrate and passivating layers were much harder and softer, respectively, than the polishing pad so that the passivating layer would be removed more quickly from high spots by the burnishing action of the pad. Bromine is far more electronegative than any of the elemental constituents of the semiconductors specifically mentioned and should react essentially indiscriminately with the semiconductors analyzed to form passivating bromine films. The data show that bromine-methanol treatments leave residual overlayers that are not completely removed by the methanol diluent of the Br-methanol etch, but require additional stripping procedures for their elimination.

The results for the different surface orientations of Si and Ge show that preferential etching during stripping may also be a factor in further reducing the thickness of the residual interface regions remaining after the bromine-methanol treatment. The most striking example occurs for silicon which shows appreciably higher $<\epsilon_2>$ values for $<111>$ than for either $<100>$ or $<110>$ surfaces. The highest values of $<\epsilon_2>$ on $<111>$ surfaces were obtained by using NH$_4$OH but it was found that NH$_4$OH degrades both the $<100>$ and $<110>$ surfaces. Hydroxides are known to be preferential etches for Si. Preferential etching can be used to smooth microscopically rough surfaces on a microscopic scale by taking advantage of widely different etching rates tangential and normal to the surface to chemically mill atomically flat regions. This suggests that the highest quality surfaces on any single crystal material may be obtained by disassembling an already perfect crystal layer by layer with judicious choices of preferential etches rather than by trying to heal the damage caused by ion bombardment and annealing in standard UHV cleaning techniques.

Although the invention has been described with respect to Group IV elements and Group III-V binary compounds, it is to be understood that the method may be used with Group III-V ternary and quaternary compounds. The method may be used also with amorphous and polycrystalline materials.

What is claimed is:

1. A method of treating a semiconductor surface comprising the steps pretreating said surface, said semiconductor being selected from the group consisting of Si, Ge, Ga-Group V compounds, and In-Group V compounds, chemomechanically polishing said surface with a mixture of a halogen and an organic solvent, said mixture consists essentially of bromine and methanol, said polishing step comprises diluting said bromine-methanol mixture from 0.05 volume percent bromine to pure methanol, and stripping residual layers.

2. A method as recited in claim 1 in which said semiconductor is selected from the group consisting of Si and Ge.

3. A method as recited in claim 2 in which said surface is Si$<111>$ and said stripping step comprises flowing solutions of HF in methanol and NH$_4$OH in H$_2$O and HF in methanol over said surface.

4. A method as recited in claim 2 in which said surface is Si$<110>$ and said stripping step comprises flowing a solution of buffered HF in methanol over said surface.

5. A method as recited in claim 2 in which said surface is Si$<100>$ and said stripping step comprises flowing a solution of HF in methanol over said surface.

6. A method as recited in claim 1 in which said semiconductor is selected from the group consisting of Ga-Group V compounds.

7. A method as recited in claim 6 in which said compound is GaAs.

8. A method as recited in claim 7 comprising the further step of stripping residual layers with H$_2$O.

9. A method as recited in claim 1 in which said semiconductor is selected from the group consisting of In-Group V compounds.

* * * * *